United States Patent [19]
Zampaglione et al.

[11] Patent Number: 5,245,584
[45] Date of Patent: Sep. 14, 1993

[54] METHOD AND APPARATUS FOR COMPENSATING FOR BIT LINE DELAYS IN SEMICONDUCTOR MEMORIES

[75] Inventors: Michael A. Zampaglione, San Jose; Hai Van Phuong, Rocklin, both of Calif.

[73] Assignee: VLSI Technology, Inc., San Jose, Calif.

[21] Appl. No.: 632,765

[22] Filed: Dec. 20, 1990

[51] Int. Cl.⁵ .................................................. G11C 7/00
[52] U.S. Cl. ...................................... 365/233; 365/194; 365/210
[58] Field of Search ............ 365/210, 233, 194, 189.01

[56] References Cited

U.S. PATENT DOCUMENTS

| | | | |
|---|---|---|---|
| 4,435,793 | 3/1984 | Ochii | 365/233 |
| 4,520,466 | 5/1985 | Mashiko | 365/210 |
| 4,985,865 | 1/1991 | Houston | 365/194 |
| 5,031,153 | 7/1991 | Suyama | 365/210 |
| 5,105,385 | 4/1992 | Ohtsuka et al. | 365/210 |
| 5,124,951 | 6/1992 | Slemmer et al. | 365/210 |
| 5,132,931 | 7/1992 | Koker | 365/210 |

FOREIGN PATENT DOCUMENTS

| | | |
|---|---|---|
| 0240156A2 | 10/1987 | European Pat. Off. . |
| 3938638 | 6/1990 | Fed. Rep. of Germany . |
| 0238228 | 9/1987 | PCT Int'l Appl. . |
| 0260983 | 3/1988 | PCT Int'l Appl. . |

*Primary Examiner*—Eugene R. LaRoche
*Assistant Examiner*—Tan Nguyen
*Attorney, Agent, or Firm*—The Hickman Law Firm

[57] ABSTRACT

A method for compensating for bit line delays in semiconductor memories including the steps of developing a dummy word line signal representative of the delay of a word line of a semiconductor memory and controlling the sense amplifier of the semiconductor memory with a control signal derived, at least in part, from the dummy word line signal. Preferably, the dummy word line signal is delayed by a fixed delay or by delay produced by a proportionally loaded dummy bit line. A circuit embodying the method of the present invention includes a dummy word which produces a dummy word signal upon the activation of any word of the semiconductor memory and a delay coupling the dummy word signal to the clock input of the sense amplifier. The delay may be a fixed delay including a number of logic elements, or it may be developed by a proportionally loaded bit line which has a fraction of the load of an actual bit line of the semiconductor memory. In either embodiment, the sense amplifier is clocked soon after the bit lines of the semiconductor memory are ready for sensing.

10 Claims, 5 Drawing Sheets

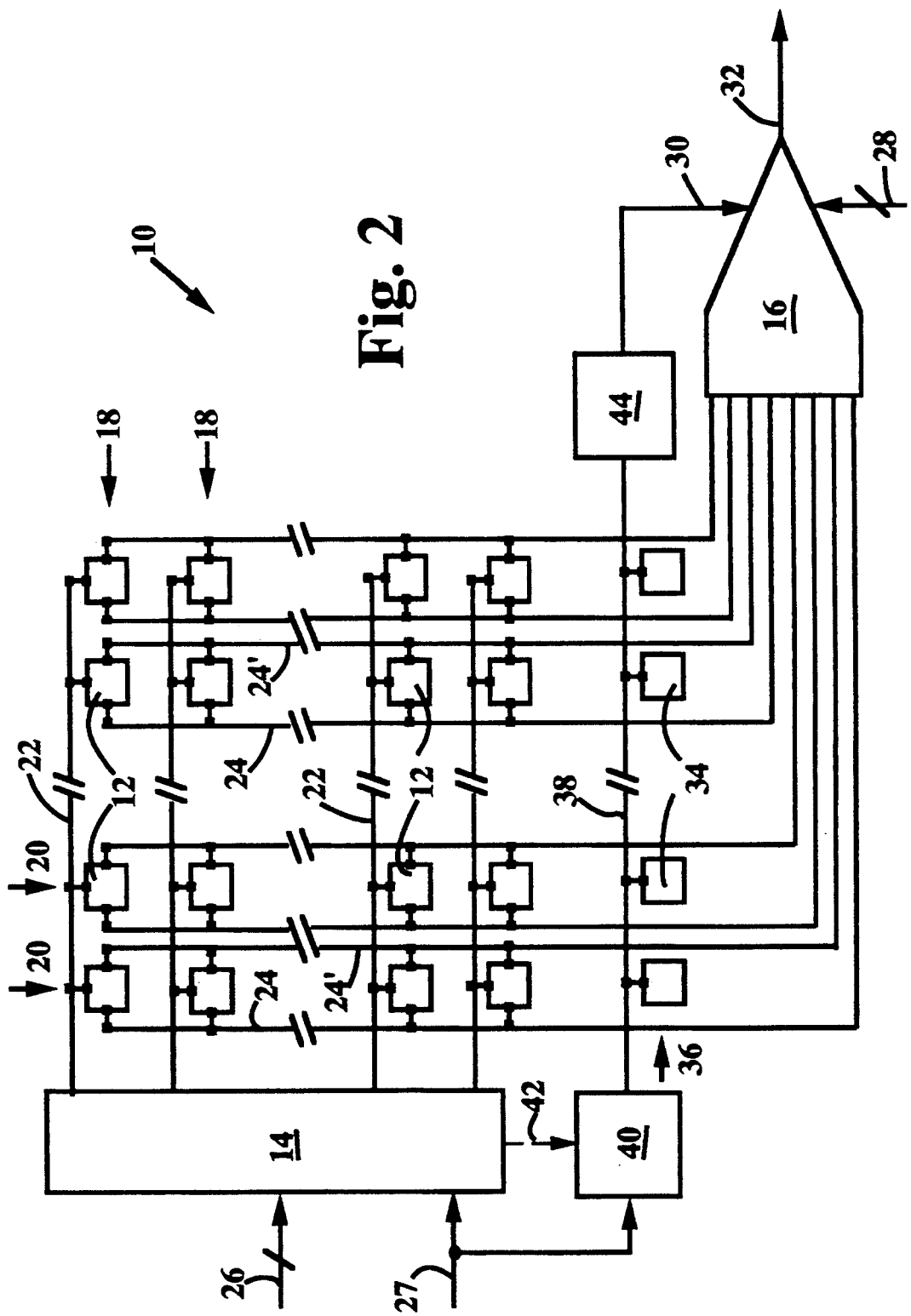

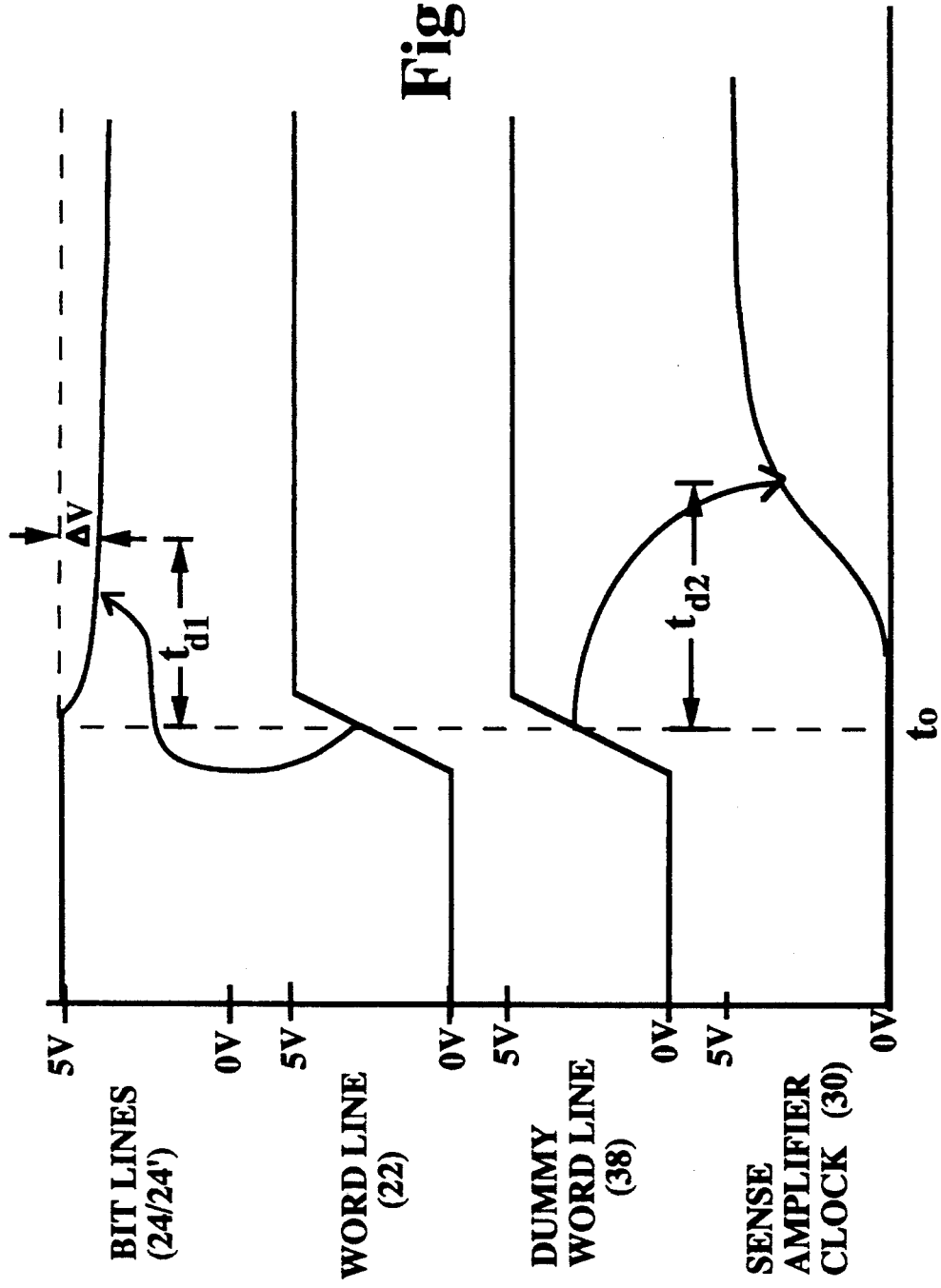

METHOD AND APPARATUS FOR COMPENSATING FOR BIT LINE DELAYS IN SEMICONDUCTOR MEMORIES

BACKGROUND OF THE INVENTION

This invention relates generally to semiconductor memories and more particularly to the read circuitry of semiconductor memories.

As digital computer systems become faster and more powerful there is an increasing demand for faster semiconductor memories. While a number of factors contribute to the overall speed of semiconductor memories, efficiently dealing with bit line delay has been a continuing problem.

With reference to FIG. 1a, prior art semiconductor memories M typically include a number of memory cells C arranged in a two dimensional array or matrix. Rows of memory cells within the matrix correspond to words W of memory, while columns of memory cells correspond to bits B within the words of memory. The rows of memory cells are coupled to a row decoder D by word lines $W_1$ and the columns of memory cells are coupled to a sense amplifier S a complementary pair of bit lines $B_1$.

During a read cycle, a row address $A_r$ is applied to the row decoder D to cause a selected word line $W_1$ to activate all of the memory cells C in that row. The memory cells develop an output on the bit lines $B_1$ representative of their memory state. The signal level on the bit lines are typically very small, i.e. often on the order of 0-5 volts d.c. The sense amplifier S senses and amplifies the signals on one of the bit line pairs selected by a column address $A_c$ to produce an output bit O corresponding to the logical content of the memory cell at the selected row and column.

Since the signals on the bit lines have a finite rise and fall time, the sense amplifier must be told when it is time to sense the bit lines in order to ensure that valid data is being sensed. The sense amplifier S is controlled by a sense amplifier clock $S_c$ which activates the sense amplifier after the activation of a word line and after the selected bit lines are ready for sensing.

A prior art method for developing the clock $S_c$ involves the use of a dummy bit line $B_d$. One end of the dummy bit line is coupled to $V_{cc}$ by a transistor $T_p$ and the other end of the bit line is coupled to sense amplifier control logic $L_s$. The dummy bit line is also coupled to each of the word lines $W_1$ by a transistor $T_w$.

In operation, the dummy bit line $B_d$ is first precharged to $V_{dd}$ by turning on transistor $T_p$ with a precharge signal. When the dummy bit line is precharged, the sense amplifier control logic $L_s$ produces a clock $S_c$ level which deactivates the sense amplifier S. When any one of the word lines $W_1$ is activated, the corresponding transistor $T_w$ is turned on and the dummy bit line $B_d$ is grounded through the transistor to cause the control logic $L_s$ to produce a clock $S_c$ level which activates the sense amplifier.

While the prior art dummy bit line method for dealing with bit line delay serves its purpose, it introduces an unnecessary delay into the read cycle, thereby increasing memory access times. This is primarily due to the fact that while the bit lines $B_1$ only have to move 0.5 volts to be sensed, the dummy bit line $B_d$ has to move approximately 2.5 volts to trigger the sense amplifier control logic $L_s$.

The nature of this problem can be clearly seen in the timing diagram of FIG. 1b. If a word line $W_1$ is activated at a time $t_0$, the bit lines may change in voltage an amount dv of approximately 0.5 volts d.c. after a first time delay of $t_{d1}$. However, the dummy bit line $B_d$ has to drop to approximately 2.5 volts d.c. after a second time delay $t_{d2}$ before the sense amplifier control logic $L_s$ can sense the change. The sense amplifier control logic has its own delay, creating a third time delay $t_{d3}$ before the sense amplifier can be clocked. Since the bit lines were ready to sense after the time delay $t_{d1}$ but are not actually sensed until time delay $t_{d3}$, the dummy bit line method of the prior art creates an excess delay of $t_{d3}-t_{d1}$ in every read cycle of the semiconductor memory.

What the prior art fails to disclose, then, is an effective method for dealing with bit line delay in semiconductor memories.

SUMMARY OF THE INVENTION

The method and apparatus of the present invention creates a faster semiconductor memory by reducing the time delay between when the bit lines are ready for sensing and when they are actually sensed by the sense amplifier. This reduces the read cycle time and greatly increases the overall efficiency of the device.

A method for compensating for bit line delay in semiconductor memories in accordance with the present invention includes the steps of developing a dummy word line signal representative of an activated word line of the semiconductor memory and controlling the sense amplifier of the semiconductor memory with a control signal derived, at least in part, from the dummy word line signal. The dummy word line signal is preferably delayed prior to its application to the sense amplifier.

The apparatus of the present invention includes a dummy word line which is activated by the selection of any word of the semiconductor memory and a delay coupling the dummy word line to the sense amplifier clock input. The delay can be a fixed delay or it can be produced by a proportionally loaded dummy bit line which has only a fraction of the capacitive load of a bit line of the semiconductor memory. Preferably, the ratio of the loads of the dummy bit line to a bit line of the semiconductor memory is proportional to the ratio of the absolute values of the bit line sense voltage level to the trigger voltage level of the sense amplifier clock circuit logic.

Since the sense amplifier is clocked from a signal derived from a dummy word line rather than from a signal derived from a dummy bit line, the problem of dummy bit line delay has been eliminated in the present invention. In fact, the use of a fixed delay to couple the dummy word line to the sense amplifier eliminates the need for a dummy bit line altogether. However, the use of a proportionally loaded dummy bit line to provide a delay may be preferable because the dummy bit line can track process and environmental variations, such as temperature, better than a fixed delay.

These and other advantages of the present invention will become clear to those skilled in the art upon a study of the detailed description of the invention and of the several figures of the drawings.

BRIEF DESCRIPTION OF THE DRAWINGS

FIG. 1b is a timing diagram illustrating the operation of the memory circuit of FIG. 1a;

FIG. 2 is a block diagram illustrating a semiconductor memory circuit having a dummy word line in accordance with the present invention;

FIG. 3 is a timing diagram illustrating the operation of the memory circuit of FIG. 2.

DETAILED DESCRIPTION OF THE PREFERRED EMBODIMENTS

Figure 1A:
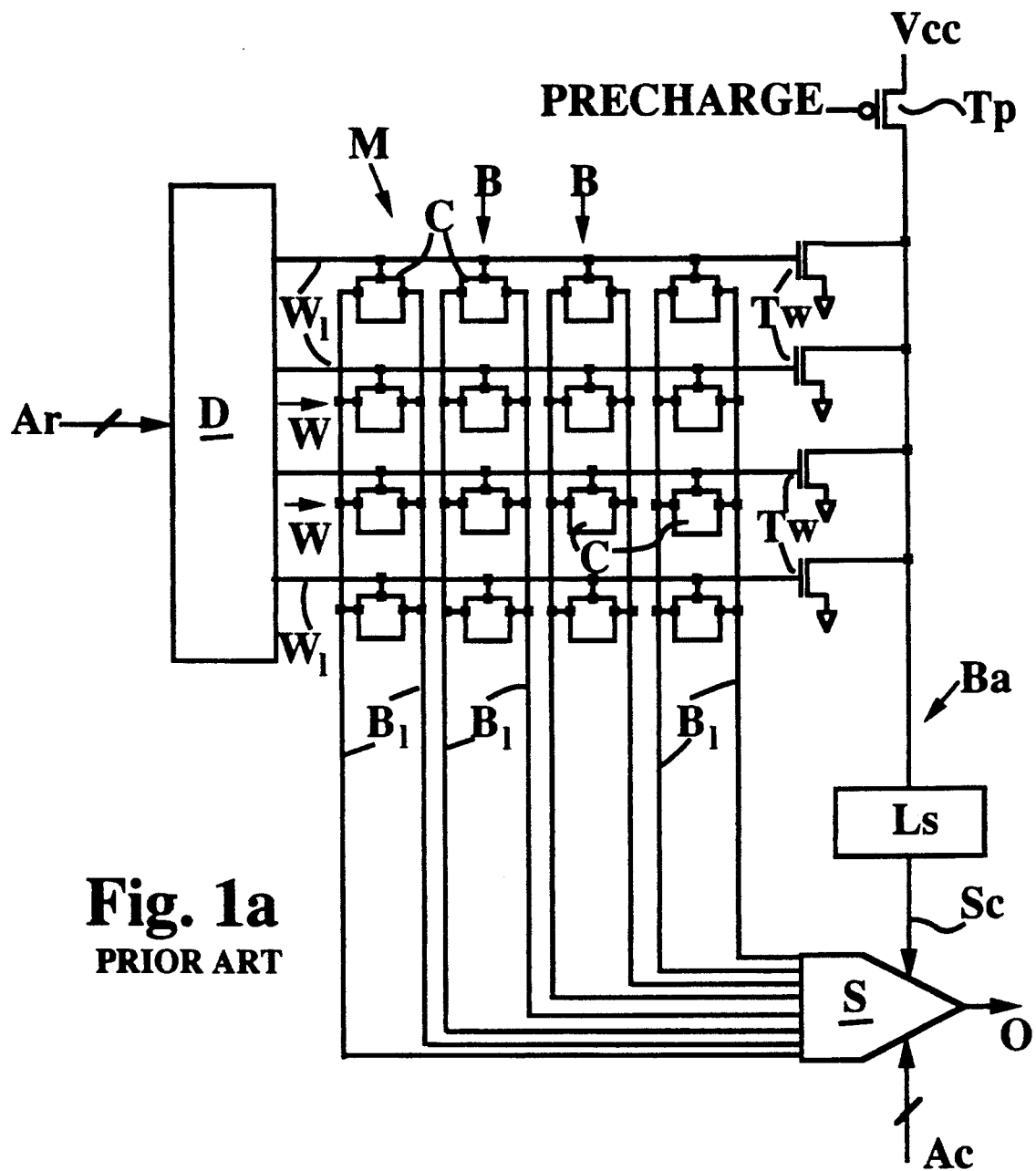
FIG. 1a is a block diagram illustrating a prior art semiconductor memory circuit including a dummy bit line.
Figure 1B:
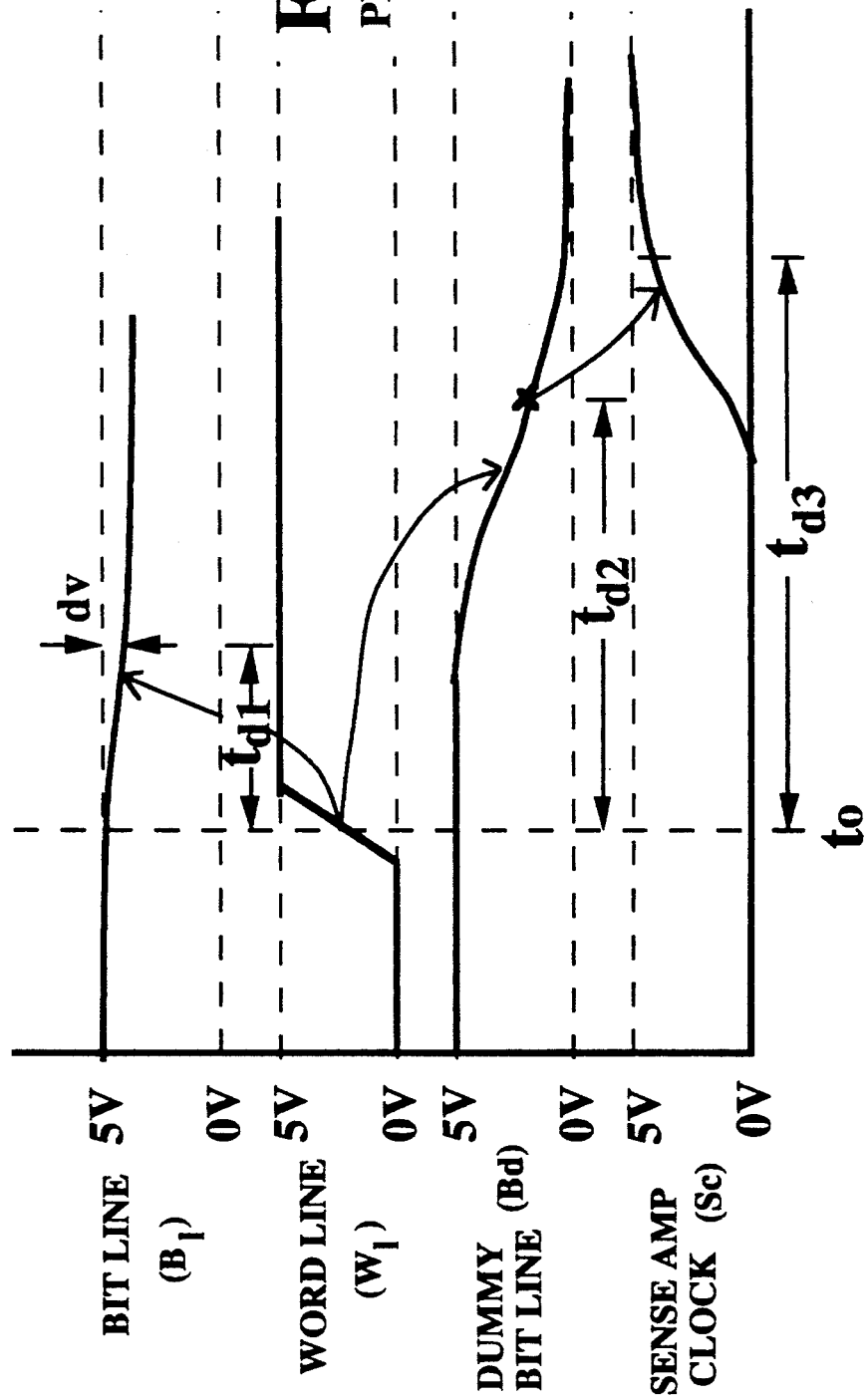

FIGS. 1a and 1b illustrate a semiconductor memory circuit of the prior art. In FIG. 2, a semiconductor memory 10 in accordance with the present invention includes a plurality of memory cells 12, a row decoder 14 and a sense amplifier 16. The memory cells 12 are arranged in a matrix including a number of rows 18 and columns 20. A row 18 of memory cells 12 comprises a word of memory, while the memory cells 12 in a column 20 comprise corresponding bits of the words of memory. The memory cells 12 of the rows 18 are coupled to word lines 22 while the memory cells 12 of the columns 20 are coupled to complementary bit lines 24 and 24'. The word lines 22 are coupled to row decoder 14 and the complementary bit lines 24 and 24' are coupled to sense amplifier 16.

During a read cycle, a row address is applied to row decoder 14 on a row address bus 26 and an enable signal is applied to the row decoder 14 on an enable line 27 to activate one of the word lines 22 and thereby enable all of the memory cells 12 on that row. Each enabled memory cell 12 will develop an output on its respective bit lines 24 and 24' corresponding to its logic state. For example, if a memory cell 12 is storing a logical 1 or HI, its output on its corresponding bit line 24 would be a voltage level corresponding to a logical 1 or HI and on its corresponding bit line 24' would be a voltage level corresponding to a logical 0 or LO. In typical CMOS semiconductor memories, the voltage differential dv between bit lines 24 and 24' when they are activated is approximately 0.5 volts d.c.

The sense amplifier 16 is responsive to a column address on a column address bus 28 and to a sense amplifier clock on a clock input 30. When activated by a clock signal on clock input 30, the sense amplifier compares the bit lines 24 and 24' for the selected column 20 of memory 10. A sense amplifier output 32 corresponds to the logical content of the memory cell 12 at the selected row and column.

To minimize delay in the read cycle, a clock signal should be provided on clock input 30 of the sense amplifier 16 soon after the bit lines 24 and 24' are ready to be sensed. For this purpose, the present invention includes a number of dummy memory cells 34 arranged in a row 36 to form a dummy word of memory. The dummy memory cells 34 are preferably similar or identical in design to the memory cells 12 but are not connected to bit lines 24 or 24'. The dummy memory cells 34 are coupled to a dummy word line 38. Since the dummy memory cells 34 are substantially the same design as the memory cells 12, the capacitive loading on dummy word line 38 will be substantially the same as the capacitive loading on the word lines 22.

The dummy word line 38 is activated by a dummy word line driver 40 which is preferably enabled by enable line 27. In this way, the selected word line 22 and the dummy word line 38 can be activated substantially simultaneously and thereby propagate similar signals. Alternatively, an enable signal can be produced on a line 42 by the row decoder to indicate that one of the word lines 22 has been activated. The signal on enable lines 27 or 42 can be generated by an address transition detector (ATD) by techniques well known to those skilled in the art or by other internal or external means.

The dummy word line 38 is coupled to the clock input 30 of sense amplifier 16 by a delay 44. As will be discussed in greater detail subsequently, the delay 44 is designed to provide a clock signal to the sense amplifier 16 soon after the bit lines 24 and 24' are ready for sensing.

As seen in FIG. 3, at a time $t_0$ an activated word line 22 will cause the bit lines 24 and 24' to begin to move until, after a time delay $t_{d1}$, they are ready to be sensed by the sense amplifier 16. Preferably, a word line 22 and the dummy word line 38 are activated substantially simultaneously, although it is possible to trigger one before the other and then appropriately trim the dummy word line delay. Dummy word line 38, after a delay caused by delay 44, creates a sense amplifier clock signal on clock input 30 of sense amplifier 16 after a time delay $t_{d2}$. The delay is chosen so that the delay time $t_{d2}$ is equal to or slightly greater than the delay time $t_{d1}$ of the bit lines 24 and 24'. In consequence, the dummy word line of the present invention allows the elimination of the excess delay in the sense amplifier clock found in the prior art.

Figure 4A:
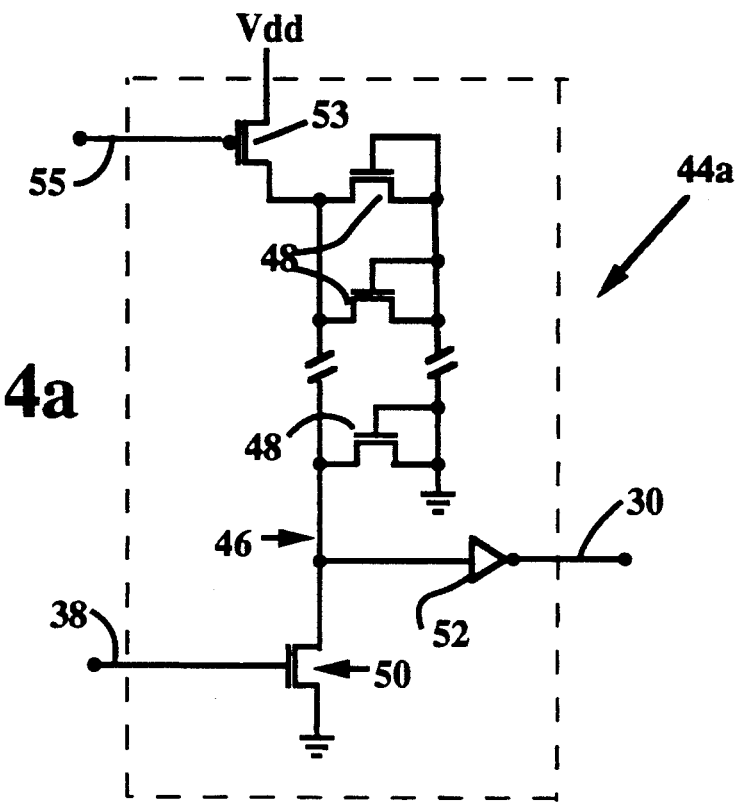
FIG. 4a is a schematic of a first embodiment of the delay logic of the memory circuit of FIG. 2.

FIG. 4a illustrates a preferred embodiment for a delay 44a which can be used in conjunction with the semiconductor memory 10 illustrated in FIG. 2. This embodiment uses a proportionally loaded dummy bit line 46 coupled to a number of n-channel MOSFET transistors 48. The drains of the transistors 48 are coupled to the dummy bit line 46 and the sources and gates of the transistors 48 are coupled to ground. The drains of the transistors are further coupled by the dummy bit line 46 to the drain of an n-channel MOSFET switching transistor 50, to an inverter 52, and to the source of a p-channel MOSFET 53. The source of switching transistor 50 is coupled to ground and its gate is coupled to the dummy word line 38. The output of inverter 52 is coupled to the clock input 30 of sense amplifier 16. The drain of transistor 53 is coupled to $V_{dd}$ and its gate is coupled to a precharge enable line 55.

The dummy bit line 46 is considered to be proportionally loaded because it has only a fraction of the capacitive load of any of the bit lines 24 or 24'. A transistor 48 has about the same capacitive load as a memory cell 12, but the delay 44a of the present invention has fewer transistors 48 attached to the dummy bit line 46 than memory cells 12 attached to the bit lines 24 and 24'.

The dummy bit line 46 is initially precharged to about 5 volts d.c. by activating precharge enable line 55. When in this state, the inverter 52 produces an approximately 0 volt signal on clock input 30 of the sense amplifier 16 to disable the sense amplifier. When the dummy word line 38 is activated, transistor 50 is turned on to discharge the dummy bit line 46, causing the inverter 52 to produce a clock signal of approximately 5 volts on clock input 30, thereby enabling the sense amplifier to sense the bit lines 24 and 24'.

Logic elements such as the inverter 52 typically require at least about a 2.5 volt signal to be activated. In contrast, the bit lines 24 and 24' only swing about 0.5 volts before they are ready to be sensed. If the trigger level for the logic (such as inverter 52) is taken as $V_l$ and the sense level for the bit lines is taken as $V_b$, then the ratio $V_l/V_b=5$ in this example. Since the rise or fall time of a voltage level of a line is directly related to the capacitive load coupled to the line, the fall time for dummy bit line 46 can be reduced by lowering its capacitive load. Therefore, if 1/5 as many transistors 48 are coupled to dummy bit line 46 as there are memory cells 12 coupled to bit lines 24 and 24', it will take approximately the same amount of time for the dummy bit line 46 to trigger inverter 52 as it does for the bit lines 24 and 24' to be ready for sensing. In other words, the capacitive load of the dummy bit line is a fraction of the load of a bit line in the proportion of the voltage level at which the bit lines are sensed to the voltage level which triggers the delay logic.

Figure 4B:
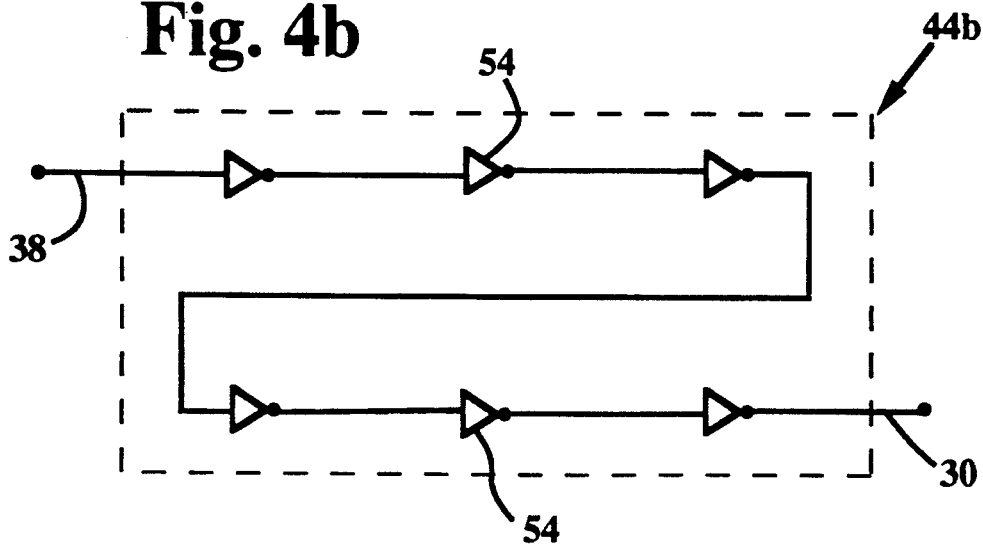
FIG. 4b is a schematic of a second embodiment of the delay logic of the memory circuit of FIG. 2.

An alternate embodiment for a delay 44b is illustrated in FIG. 4b. This fixed delay includes an even number of inverters 54 coupled between the dummy word line 38 and the clock input 30 to the sense amplifier 16. In operation, the signal on the dummy word line 38 is simply delayed by passing through the logic elements comprising the inverters 54 and triggers the sense amplifier 16 after a fixed delay time.

Delay 44a has a number of advantages over delay 44b. Firstly, the delay 44a is well adapted to the automated design of semiconductor memories. Since there are commercially available software design tools known as memory compilers which permit the computerized design of memories of arbitrary size, the software can be easily adapted to produce a delay 44a having the correct proportion of transistors 48 to the number of words in the memory. An example of a memory compiler is the CRAMO3 TM memory complier marketed by VLSI Technology, Inc. of San Jose, Calif. Secondly, the delay 44a is similar in structure to an actual bit line and therefore will track process and environmental changes better than the fixed delay 44b. For example, as the temperature of the semiconductor memory changes, the delays produced by both the bit lines of the array and the proportionally loaded dummy bit line of delay 44a will move in concert to thereby compensate for the temperature change. The delay 44b, however, may be attractive due to its design simplicity and because it can be trimmed by a human designer to produce an optimal amount of delay. It should be noted, however, both the delays 44a and 44b are, to some extent, fixed delays because they are not variable other than due to a change in environmental condition after they are manufactured into the semiconductor memory circuit.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. A method for compensating for bit line delay in a semiconductor memory including a matrix of memory cells, at least one word line and at least one bit line coupled to said matrix and a sense amplifier coupled to said at least one bit line, said method comprising:

developing a dummy word line signal representative of the delay of a word line of a semiconductor memory;

delaying said dummy word line signal by coupling said dummy word line signal to a dummy bit line load that is a fraction of a bit line load; and controlling a sense amplifier of said semiconductor memory with a sense amplifier control signal derived, at least in part, from said dummy word line signal, whereby said sense amplifier control signal is operative to activate said sense amplifier when a bit line of said semiconductor memory is ready for sensing.

2. A method as recited in claim 1 wherein said step of developing a dummy word signal comprises providing a row of dummy memory cells connected by a dummy word line which is enabled substantially concurrently with the enablement of a word line of said semiconductor memory.

3. A method as recited in claim 2 wherein said step of delaying said dummy word signal comprises delaying said dummy word line signal by a fixed amount.

4. A circuit for compensating for bit line delays in semiconductor memories including a matrix of memory cells, at least one word line and at least one bit line coupled to said matrix, and a sense amplifier coupled to said at least one bit line, said circuit comprising:

dummy word means responsive to the selection of a word line of a semiconductor memory and operative to produce a dummy word line signal; and delay means responsive to said dummy word line signal and operative to develop a sense amplifier control signal which activates a sense amplifier of said semiconductor memory after a bit line of said semiconductor memory is ready for sensing, said delay means including a dummy bit line load having a fraction of the load of a bit line of said semiconductor memory, and means coupling said dummy bit line load to said dummy word means.

5. A circuit as recited in claim 4 wherein said delay means is a fixed delay.

6. A circuit as recited in claim 4 wherein said fraction is approximately equal to the proportion of a bit line signal level to the trigger level of a logic element which provides said sense amplifier control signal.

7. A semiconductor memory circuit comprising:

a matrix of memory cells arranged into a plurality of rows and a plurality of columns, where each row comprises a word of memory;

a plurality of bit lines associated with said columns of said memory cells;

a plurality of word lines associated with said rows of said memory cells;

a row decoder responsive to a row address and operative to activate one of said rows of memory cells;

a sense amplifier responsive to said plurality of bit lines and to a column address and operative to develop an output representative of the contents of a memory cell at a selected row and column in said matrix;

a plurality of memory cells arranged as a dummy word and a dummy word line coupling said memory cells of said dummy word together;

dummy word activation means operative to develop a dummy word line signal on said dummy word line upon the activation of any word line of said matrix; and delay means coupled between said dummy word line and said sense amplifier and operative to develop an enabling signal for said sense amplifier when said bit line is ready for sensing, said delay means comprising a dummy bit line coupled to said dummy word line, said dummy bit line comprising a fraction of the load of a bit line of said matrix.

8. A semiconductor memory circuit as recited in claim 7 wherein said dummy word is similar in design to said words of memory but is not connected to said bit lines.

9. A semiconductor memory circuit as recited in claim 7 wherein said delay means is a fixed delay.

10. A semiconductor memory circuit as recited in claim 7 wherein said fraction is approximately equal to the proportion of a bit line signal level to a trigger level of said sense amplifier control signal.

* * * * *